United States Patent [19]

Yoshitome et al.

[11] Patent Number: 5,089,784
[45] Date of Patent: Feb. 18, 1992

[54] METHOD FOR RESTRICTING REGION FOR MAGNETIC RESONANCE IMAGING

[75] Inventors: Eiji Yoshitome; Susumu Kosugi, both of Tokyo, Japan

[73] Assignee: Yokogawa Medical Systems, Limited, Tokyo, Japan

[21] Appl. No.: 499,449
[22] PCT Filed: Dec. 24, 1988
[86] PCT No.: PCT/JP88/01333
 § 371 Date: Jun. 22, 1990
 § 102(e) Date: Jun. 22, 1990
[87] PCT Pub. No.: WO89/06109
 PCT Pub. Date: Jul. 13, 1989

[30] Foreign Application Priority Data

Dec. 25, 1987 [JP] Japan .................... 62-329322

[51] Int. Cl.$^5$ ............................ G01R 33/20
[52] U.S. Cl. .................................. 324/309
[58] Field of Search .............. 324/309, 307, 312, 314; 128/653 A

[56] References Cited

U.S. PATENT DOCUMENTS

| 4,737,714 | 4/1988 | Hanawa | 324/309 |
| 4,777,439 | 10/1988 | Granot | 324/309 |
| 4,887,035 | 12/1989 | Hanawa | 324/309 |
| 4,894,616 | 1/1990 | Yoshitome et al. | 324/309 |
| 4,924,183 | 5/1990 | Kunz et al. | 324/309 |

Primary Examiner—Hezron E. Williams
Assistant Examiner—Louis M. Arana
Attorney, Agent, or Firm—Moonray Kojima

[57] ABSTRACT

The method for restricting a region for magnetic resonance imaging, in accordance with the present invention, comprising a step of measuring a spin-echo signal from an object by a pulse sequence of Fourier transformation technique;

a step of measuring a spin-echo signal from an object by a pulse sequence comprising adding a selective 180°±x pulse and a selective 180°±y pulse following a 180° pulse in the pulse sequence of Fourier transform technique, the integral of gradient magnetic fields for selection thereof being 0; and a step of reconstructing an image from the addition or subtraction between the spin-echo signals measured by the two sequences.

4 Claims, 4 Drawing Sheets

METHOD FOR RESTRICTING REGION FOR MAGNETIC RESONANCE IMAGING

BACKGROUND OF INVENTION

1. Industrial Field of Utilization

The present invention relates to a method for restricting a region in magnetic resonance imaging, in order to selectively image a limited region inside an object.

2. Prior Art

The magnetic resonance imaging system (referred to as MR-CT hereinafter) for projecting a tomographic image which is obtained by utilizing the phenomenon of magnetic resonance (referred to as MR hereinafter) of a specific species of atomic nucleus as a target, has conventionally been known. The imaging based on Fourier transform technique will now be explained in detail hereinbelow.

The pulse sequence of one view, for applying a high-frequency magnetic field and gradient magnetic fields, is constructed as shown in FIG. 4. In the figure, RF represents a high-frequency, rotating magnetic field, imposing a 90° pulse and a 180° pulse to the x axis. $G_x$ is a fixed gradient magnetic field which is applied on the x axis called lead axis; $G_y$ is a variable gradient magnetic field applied to the y axis called warp axis; $G_z$ is a fixed gradient magnetic field which is applied on the z axis called slice axis. The signal represents spin-echo signal, i.e. SE signal, after a 180° pulse. The intervals are shown in order to indicate when a signal from gradient magnetic fields is applied to each axis. In the interval 1, spins in the slice plane vertical to the z axis are selectively excited by a 90 pulse and a slice gradient, $G_z^+$. $G_x^+$ in the interval 2 is referred to as diffuse gradient, which disturbs and inverse a spin phase using a 180° pulse. $G_z^-$ functions for recovering the original spin phase after disturbance by $G_z^+$. In the interval 2, a warp gradient $G_{yn}$ is also applied. This functions for shifting the spin phase, in proportion with the position on the y direction. The intensity thereof is controlled so that it may vary in each interval. In the interval 3, a 180° pulse is imposed to observe an SE signal appearing in the interval 4. In the interval 4, $G_x^+$ is a readout gradient, which is also a gradient magnetic field to align a disturbed magnetic field to induce an SE signal. The center of an SE signal is located at the position where the area of the readout gradient equals that of the diffuse gradient. Such sequence is repeated every pulse repeating interval $T_R$, for a given number of views.

In MR-CT described above, there is obtained a tomographic image on a slice plane which is excited selectively along the z axis due to a 90° pulse and a gradient magnetic field $G_z^+$ called slice gradient. According to the so-called three dimensional zoom scan comprising restricting the region of a tomographic image to the directions of x and y axes and selectively imaging the region 23 for zooming up, as is shown in FIG. 6, the region should be restricted on the directions of x, y and z axes. In the figure, 21 is a display such as CRT, which displays a tomographic image 22. 23 is a field of vision (referred to as FOV hereinafter), which is obtained through three dimensional zoom scan. By the three dimensional zoom scan, the region is restricted to the three directions comprising the thickness direction together with the directions of FOV 23. If imaging is carried out without restricting the region in such manner, there may occur an overlapping of an image within FOV 23 with folded images in the region exceeding FOV 23. For that reason, the selective excitation of magnetization vector has been carried out conventionally, by applying individual gradient fields together with a 90° excitation pulse and a 180° inversion pulse for restricting the region to two directions, a warp direction 1 and a warp direction 2. Because it has not been possible on a sequence to restrict the region to a readout direction as the remaining direction, however, an electric filter has been used to restrict the region by its band filtering, when an echo signal is received and detected. Because the positional difference in the intensity of a magnetic field is induced by the gradient magnetic field from the readout gradient, there may occur the positional difference in the Lamour frequency, which enables the region restriction by detection with an electric filter.

The sequence of the conventional three dimensional Fourier technique is shown in FIG. 2. In the FIG., 31 is a 90° excitation pulse, which simultaneously applied to the z axis a slice gradient 32 corresponding to the pulse width of the 90° excitation pulse. 33 is a warp gradient which is applied to the z axis; 34 is a warp gradient applied to the y axis, which imposes a slice gradient 36 on the y axis at the application of a 180° pulse, and restrict the region along the two directions, the y and z axes. 37 is a diffuse gradient applied on the x axis, which produces an SE signal (figures are not shown) using the readout gradient 38. Spoilers 39a, 39b and 39c disturb magnetization vector after signal detection, to eliminate its influence over the following view. According to the conventional technique, the region restriction is carried out along the y and z axes, while the frequency component of the signals produced along the x axis is subjected to the restriction by an electric filter, to obtain a three dimensional image.

The technique carried out by restricting the region using an electric filter, requires the electric filter to have a very sharp cut-off property. It is very difficult to obtain a filter with such property in view of technology and even if it should be obtained, it might cost very expensive.

DISCLOSURE OF INVENTION

The object of the present invention is to provide an magnetic resonance imaging technique comprising restricting a region employing a pulse sequence without using an electric filter.

The magnetic resonance imaging technique of the present invention comprises a step of measuring a spin-echo signal from an object by a pulse sequence of Fourier transform technique;

a step of measuring a spin-echo signal from an object by a pulse sequence comprising adding a selective 180°±x pulse and a selective 180°±y pulse following a 180° pulse in the pulse sequence of Fourier transform technique, the integral of the gradient magnetic fields for selection thereof being 0; and a step of reconstructing an image from the addition or subtraction between the spin-echo signals measured by the two sequences.

BEST MODE FOR CARRYING OUT THE INVENTION

An example of the technique in accordance with the present invention will now be illustrated in detail hereinafter with reference to drawings.

Figure 1:
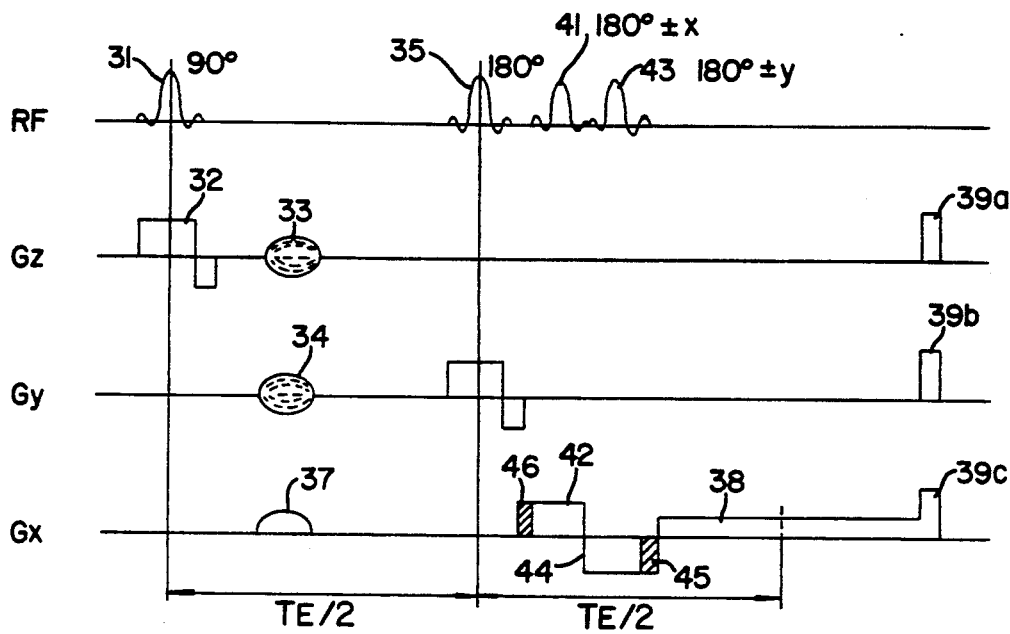
FIG. 1 is a diagram showing the pulse sequence of an example of the present invention.

The pulse sequence of the restriction technique of region is shown in FIG. 1. This sequence is constructed by adding a number of sequences to the conventional pulse sequences. In the figure, the same symbols are used in the identical pulses of FIG. 2. For explanation of the newly added pulses, 41 is a 180°±x pulse which is for example a high-frequency pulse having an initial phase being 0 with a pulse envelope; 42 is a selective gradient which is applied on the x axis at the application of a 180°±x pulse 41. This selective gradient functions to set a desired FOV 23 on the direction of the x axis. 43 is a 180°±y pulse which is also applied to the RF axis and where the phase of a high-frequency signal within a pulse envelope is made to vary by 90° or 270° from that of 180°±x pulse 41. 44 is a selective gradient applied to the x axis, having the intensity equal to that of the selective gradient 42 and being imposed in the reverse phase to that of the selective gradient 42. 45 is a spoiler which eliminates the effects of the selective gradients 42 and 44 so that a side lobe may not appear on an image; 46 is a spoiler having the same area as that of the spoiler 45 and being applied on the spoiler 45 in the reverse phase in order to remove the effects of the spoiler 45. Such sequence is employed together with the conventional pulse sequence in FIG. 2, and the two sequences are repeated for a given number of views while having a common number of warps to collect SE signals, individually.

Figure 2:
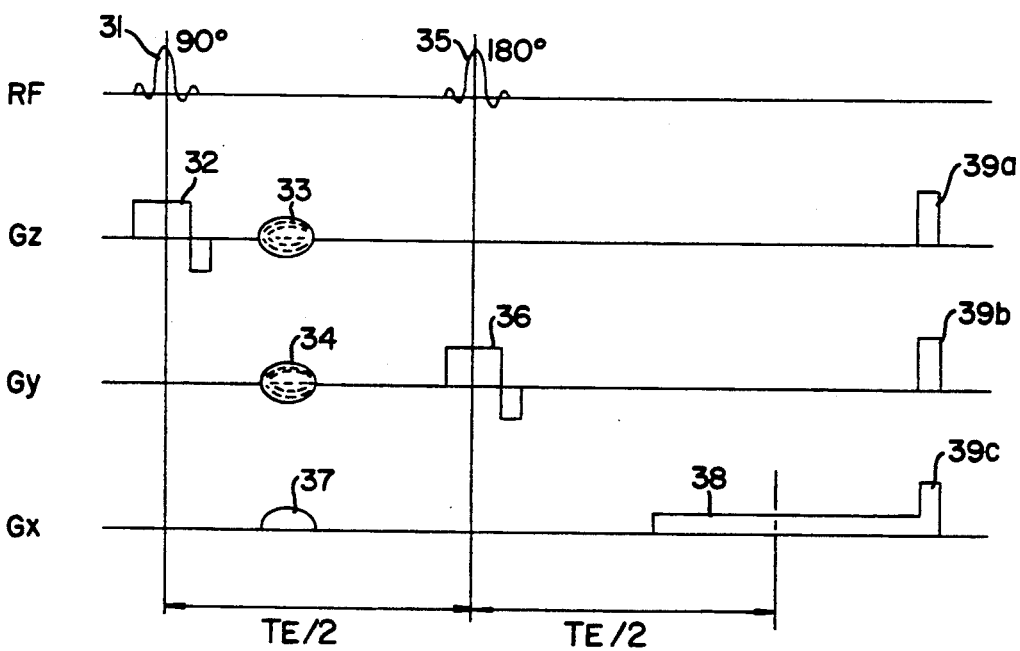
FIG. 2 is a diagram showing the pulse sequence for obtaining a normal three dimensional image.
Figure 5A:
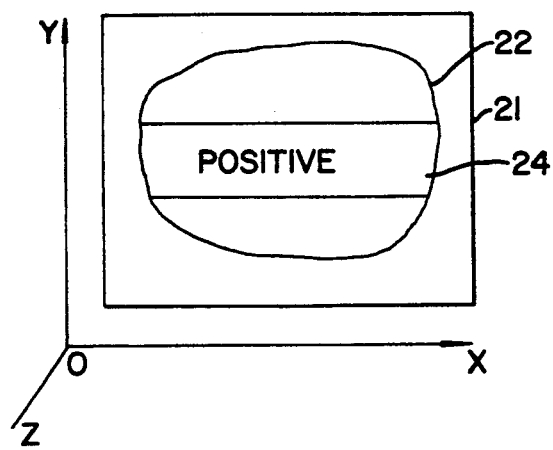
FIG. 5A is a schematic view of an image data obtained by the pulse sequence of FIG. 2.
Figure 5B:
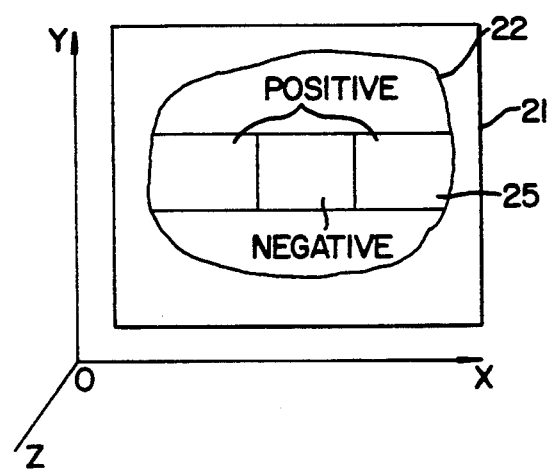
FIG. 5B is a schematic view of an image data obtained by the pulse sequence of FIG. 1.

The rotating, high-frequency magnetic field by 180°±x pulse 41 and the rotating, high-frequency magnetic field by 180°±y pulse 43 are then applied to the same axis to make the magnetization vector within FOV rotate following the formula 180°±x x 180°±y=180° z, while the phase of the SE signal in the FOV 23 is made to proceed by 180° on the z axis. Consequently, the positive or negative polarity thereof get inverted. Because the integral value of the selective gradients 42 and 44, which are applied at the 180°±x pulse 41 and 180°±y pulse 43, respectively, is selectively preset at 0, an echo signal outside FOV is generated as in normal condition, without inverting its polarity. This status in correspondence with a reconstructed region of an image is shown in FIG. 5. FIG. 5B shows a data region, including a region which is restricted on the directions of the y and z axes and wherein signals in the region determined by a 180°±x pulse 41 and a 180°±y pulse 43 are inverted of their original positive or negative polarities. In the region 25, the part "negative" corresponds to the part where the polarity is inverted, while the part "positive" is the part where the polarity is not inverted. The part where the polarity is inverted, corresponds to FOV. The data obtained by the conventional three dimensional Fourier technique shown in FIG. 2 is depicted in FIG. 5A. In FIG. 5A, 24 is a region restricted to the directions of the y and z axes, and the signals with normal polarity may be obtained from the region.

Figure 6:
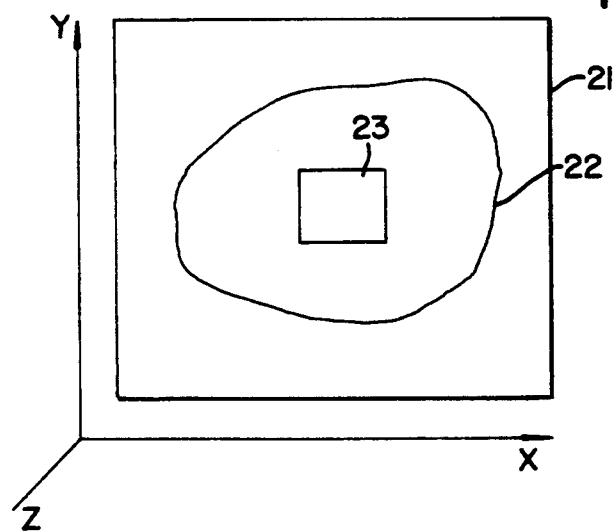
FIG. 6 is a view of FOV obtained by the three dimensional zoom scanning.

When calculating the difference between the data of the region 24 and that of the region 25, the negative regions at the two centers are added to each other while the regions except the above regions are subtracted from each other, generating the data of FOV 23 shown in FIG. 6. Thus, when reconstructing an image from such difference in the data, only the image of FOV 23 is obtained. Or, the data of the region 24 and those of the region 25 may separately be used to reconstruct images and then, the subtraction between the two images may project an image of FOV 23.

Figure 3:
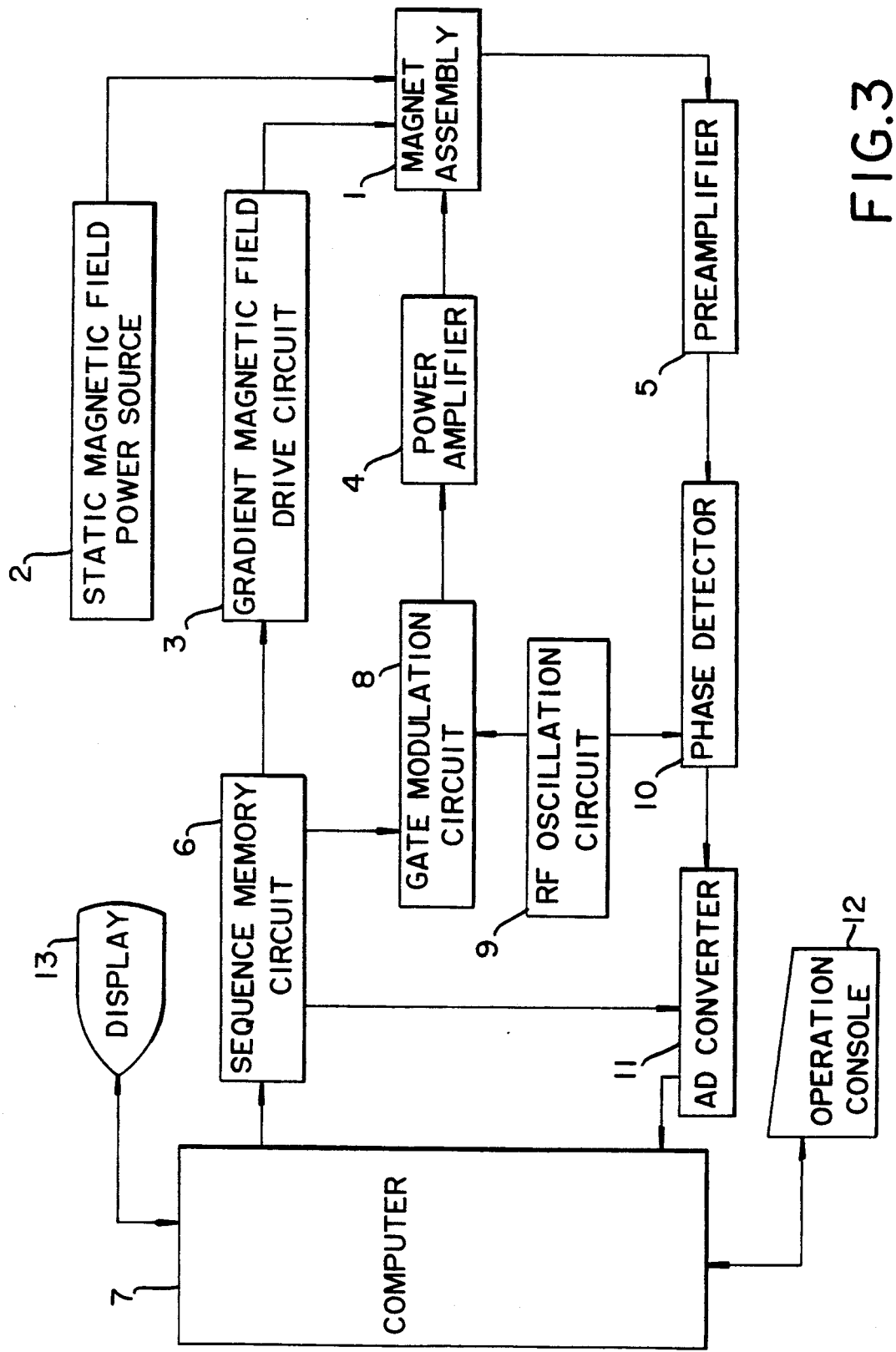
FIG. 3 is a conceptual schematic view of MR-CT for practicing the technique of the example of the present invention.
Figure 4:
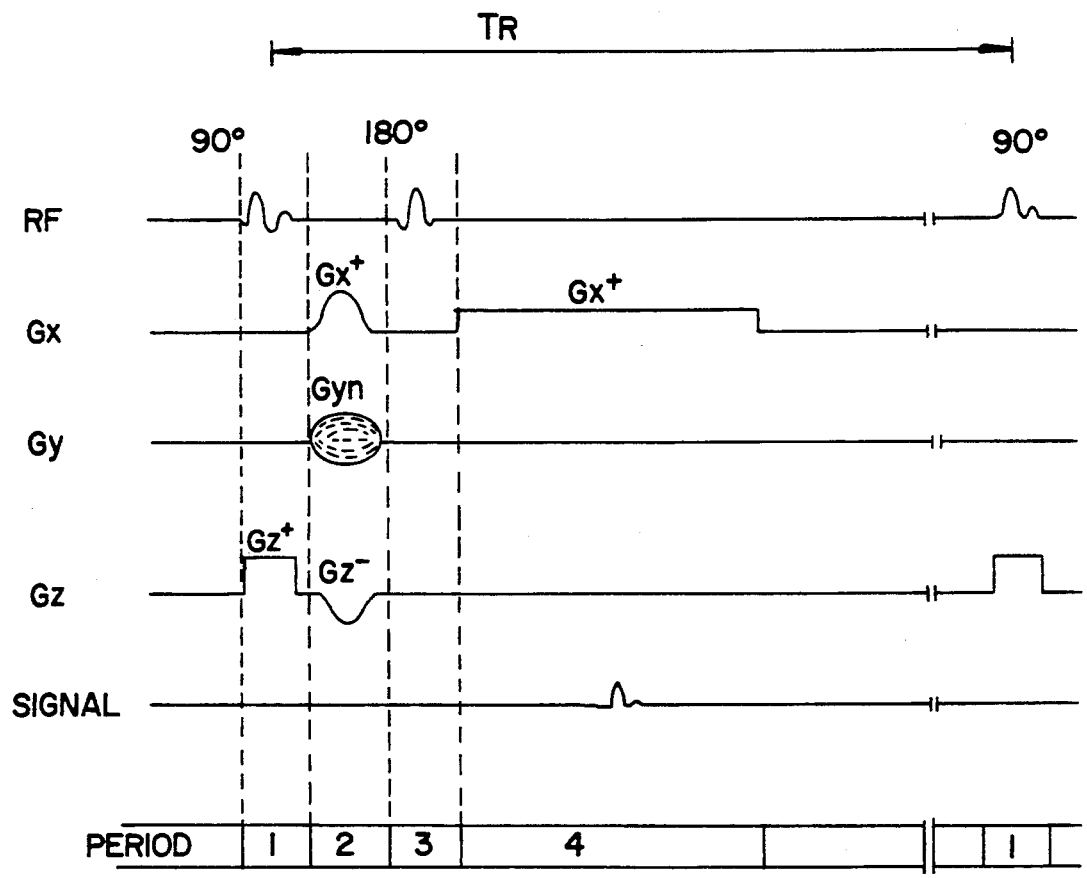
FIG. 4 is a diagram showing a pulse sequence of Fourier transform technique.

FIG. 3 is a conceptual schematic view of MR-CT for practicing such technique.

In the figure, 1 is a magnet assembly which has a space (housing) to insert an object thereinside and where surrounding the space, a static magnetic coil applying a given static field on the object, gradient magnetic field coils to generate gradient magnetic fields (the gradient magnetic field coils are equipped with coils for the three axes, x, y and z), an RF sending coil supplying an RF pulse to excite nuclear spin in the object, a receiving coil for detecting NMR signals from the object and the like. The static magnetic field coil, the gradient magnetic field coil, the RF sending coil and the receiver coil are connected to a static field power source 2, a gradient field drive circuit 3, an RF power amplifier 4 and a preamplifier 5, respectively. A sequence memory circuit 6 operates a gate modulation circuit 8 in an optional view, following the direction from a computer 6 (modulates RF output signals from a RF oscillator circuit 9 at a preset timing), to impose the RF pulse signals based on the aforementioned sequence of FIGS. 1 and 2 through an RF power amplifier 4 to an RF sending coil. The sequence memory circuit 6 supplies gradient fields to the three axes, the x,y and z axes, individually, based on the sequences as shown in FIGS. 1 and 2. 10 is a phase detector, for phase-detecting the signal output received from the preamplifier 5 by using output of an RF oscillator circuit 9 as reference signal. This output signal is transformed into a digital signal by an AD transformer 11, which is input into a computer 7. The computer 7 processes these input signals in the above manner to reconstruct an image. 12 is an operation console to make direction to realize various pulse sequences and input various preset values and the like; 13 is a display system to display an image reconstructed by a computer 7.

As has been described above, according to the technique of the present invention, only the pulse sequence can restrict a region without using specific hardware systems. The present invention may not be limited by the above examples.

The envelope of a 180°±x pulse and a 180°±y pulse may be manipulated to selectively inverse the outer region of FOV, namely, the positive region of FIG. 6B, into negative. In this case, the region is restricted by adding the SE signals obtained by two kinds of sequences. In FIG. 1, the sequence for applying a 180°±x pulse 41 and a 180°±y pulse may be reversed. The three dimensional zoom scanning has been described heretofore, and the region restriction toward a direction of one axis may be realized even at routine three dimensional, or two dimensional imaging. The selective gradients 42 and 44 which are included in a readout gradient, according to the example, may be arranged alternatively on the axis where the slice gradient 32 or 36 has been set and removed. In the present example, the spoilers having equal area and being in reverse phases to each other, namely, spoilers 45 and 46, are included in a readout gradient, but they may be set in other gradients such as a slice gradient.

Best mode of practicing the present invention has been explained heretofore, but it may be easier that the skilled person in the art of the present invention may practice various modification thereto without departing the scope of claims described below.

What is claimed is:

1. In a method of magnetic resonance imaging wherein a first spin echo signal of an object is obtained by applying a first RF pulse sequence comprising 90° and 180° pulses and at least one gradient magnetic field applied along one axis; the improvement comprising the steps of obtaining a second spin echo signal of said object by applying a second RF pulse sequence comprising said first RF pulse sequence and after the 180° pulse of said first RF pulse sequence a selective 180°±X pulse and a selective 180°±Y pulse, and an added pair of magnetic fields applied along said one axis with an integral therebetween of zero and applied during the selectively added RF pulses;

selectively combining said first and second spin echo signals; and reconstructing an image of said object by utilizing a Fourier transform technique and the combined first and second spin echo signals, so that a restricted region of imaging is attained.

2. In a method of magnetic resonance imaging wherein a first spin echo signal of an object is obtained by applying a first RF pulse sequence comprising 90° and 180° pulses and at least one gradient magnetic field applied along one axis; the improvement comprising the steps of obtaining a second spin echo signal of said object by applying a second RF pulse sequence comprising said first RF pulse sequence and after the 180° pulse of said first RF pulse sequence a selective 180°±X pulse and a selective 180°±Y pulse, and an added pair of magnetic fields applied along said one axis with an integral therebetween of zero and applied during the selectively added RF pulses;

reconstructing a first image of the object by utilizing a Fourier transform technique and said first spin echo signal;

reconstructing a second image by utilizing a Fourier transform technique and said second spin echo signal; and projecting an image of the object by selectively combining said first image and said second image, so that a restricted region of imaging is attained.

3. The method of claim 1, wherein said Fourier transform technique is a three dimension Fourier transform technique.

4. The method of claim 2, wherein said Fourier transform technique is a three dimension Fourier transform technique.

* * * * *